United States Patent
Tosuke

(10) Patent No.: US 10,424,699 B2
(45) Date of Patent: Sep. 24, 2019

(54) LIGHT EMITTING DEVICE

(71) Applicant: NICHIA CORPORATION, Anan-shi (JP)

(72) Inventor: Hideaki Tosuke, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/441,244

(22) Filed: Feb. 24, 2017

(65) Prior Publication Data
US 2017/0250325 A1 Aug. 31, 2017

(30) Foreign Application Priority Data

Feb. 26, 2016 (JP) .................. 2016-035723
Dec. 8, 2016 (JP) .................. 2016-238108

(51) Int. Cl.
| | | |
|---|---|---|
| *H01L 33/50* | (2010.01) | |
| *H01L 33/62* | (2010.01) | |
| *H01L 33/48* | (2010.01) | |
| *H01L 33/56* | (2010.01) | |

(52) U.S. Cl.
CPC .......... *H01L 33/507* (2013.01); *H01L 33/486* (2013.01); *H01L 33/56* (2013.01); *H01L 33/62* (2013.01); *H01L 2224/73265* (2013.01); *H01L 2224/8592* (2013.01)

(58) Field of Classification Search
CPC ..... H01L 33/507; H01L 33/486; H01L 33/56; H01L 33/62; H01L 2224/73265; H01L 2224/8592
See application file for complete search history.

(56) References Cited

U.S. PATENT DOCUMENTS

2003/0086271 A1* 5/2003 Masuoka .................. F21V 7/10
362/345
2004/0046242 A1* 3/2004 Asakawa ............ H01L 31/0203
257/678
2006/0192222 A1* 8/2006 Chen ..................... H01L 33/645
257/99

(Continued)

FOREIGN PATENT DOCUMENTS

| JP | 2008-258233 | 10/2008 |
| JP | 2010-199547 | 9/2010 |
| JP | 2012-69539 | 4/2012 |

*Primary Examiner* — Syed I Gheyas
(74) *Attorney, Agent, or Firm* — Mori & Ward, LLP

(57) ABSTRACT

A light emitting device includes lead electrodes, and a housing including a resin molded body. The resin molded body has a first outer surface facing toward a first direction, a second outer surface facing toward a second direction perpendicular to the first direction, and a recess having an opening on the second outer surface and a bottom opposite to the opening in the second direction. Each of the lead electrodes includes an outer lead portion, and an inner lead portion to define the bottom of the recess. The outer lead portion is provided on the first outer surface and includes an inward surface and an outward surface opposite to the inward surface. The inward surface faces the first outer surface and is covered by a light-transmissive covering film. The outward surface is opposite to the inward surface in the first direction and is exposed from the light-transmissive covering film.

21 Claims, 4 Drawing Sheets

(56) References Cited

U.S. PATENT DOCUMENTS

| | | | |
|---|---|---|---|
| 2007/0187709 A1* | 8/2007 | Yamamoto | H01L 33/483 257/99 |
| 2010/0171144 A1* | 7/2010 | Kong | H01L 33/486 257/99 |
| 2010/0193822 A1 | 8/2010 | Inobe et al. | |
| 2011/0175127 A1* | 7/2011 | Kanada | H01L 33/60 257/98 |
| 2015/0280077 A1 | 10/2015 | Wakaki | |

* cited by examiner

LIGHT EMITTING DEVICE

CROSS-REFERENCE TO RELATED PATENT APPLICATIONS

The present application claims priority to Japanese Patent Application No. 2016-035723, filed on Feb. 26, 2016, and Japanese Patent Application No. 2016-238108, filed on Dec. 8, 2016. The contents of these applications are incorporated herein by reference in their entireties.

BACKGROUND

Technical Field

The present disclosure relates to a light emitting device.

Discussion of the Background

For example, Japanese Unexamined Patent Application Publication No. 2008-258233 describes a side-emission type light emitting device in which connecting portions of lead members to connect to a wiring substrate are extended and bent forward from a reflective case.

SUMMARY OF THE INVENTION

According to one embodiment of the present invention, a light emitting device includes a housing and at least one light emitting element. The housing includes a resin molded body and lead electrodes. The resin molded body has a first outer surface facing toward a first direction, a second outer surface facing toward a second direction perpendicular to the first direction, and a recess having an opening on the second outer surface and a bottom opposite to the opening in the second direction. The lead electrodes are provided in the resin molded body. Each of the lead electrodes includes an outer lead portion and an inner lead portion. The outer lead portion is provided on the first outer surface. The outer lead portion includes an inward surface and an outward surface opposite to the inward surface. The inward surface faces the first outer surface and is covered by a light-transmissive covering film, and the outward surface is opposite to the inward surface in the first direction and is exposed from the light-transmissive covering film. The inner lead portion is provided to define the bottom of the recess and connected to the outer lead portion. The at least one light emitting element is provided in the recess and electrically connected to the lead electrodes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
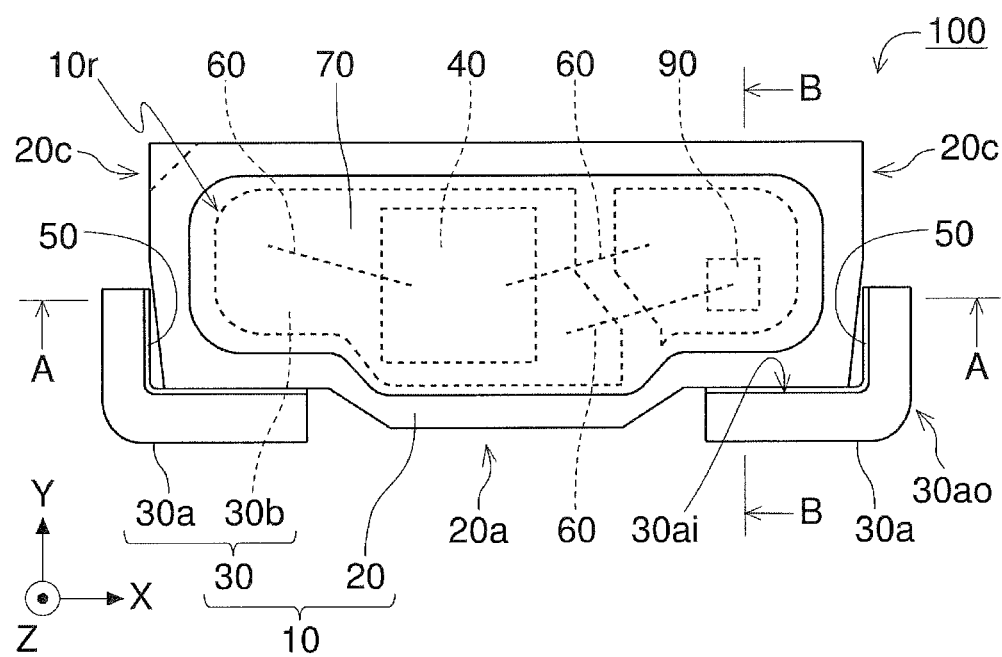
FIG. 1A is a schematic front view of a light emitting device according to one embodiment of the present invention.

The embodiments will now be described with reference to the accompanying drawings, wherein like reference numerals designate corresponding or identical elements throughout the various drawings.

Next, certain embodiments of the present disclosure will be described below with reference to the drawings. The light emitting device described below is intended as illustrative, to give a concrete form to technical ideas of the present invention, and the scope of the present invention is not limited to those described below unless otherwise specified. Further, the size, positional relationship and the like of the constituent members shown in the drawings may be occasionally shown exaggerated for the sake of clarity.

In the description below, the wavelength range of visible light is 380 nm to 780 nm, the wavelength range of blue light is 420 nm to 480 nm, the wavelength range of green to yellow light is 500 to 590 nm, and the wavelength range of red light is 610 nm to 750 nm.

First Embodiment

Figure 1B:
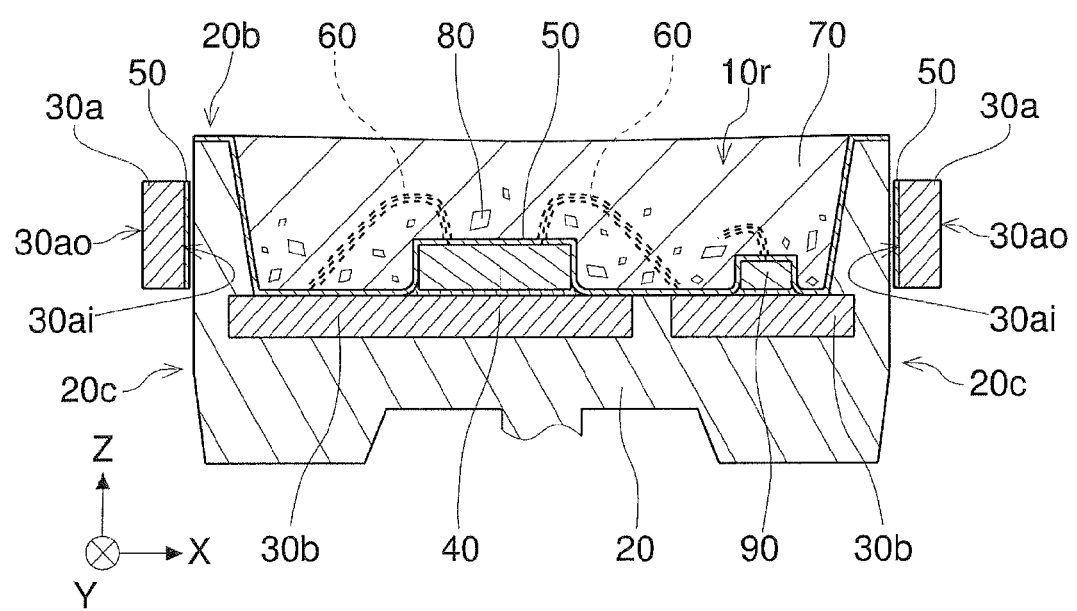
FIG. 1B is a schematic cross sectional view taken along line A-A of FIG. 1A.
Figure 1C:
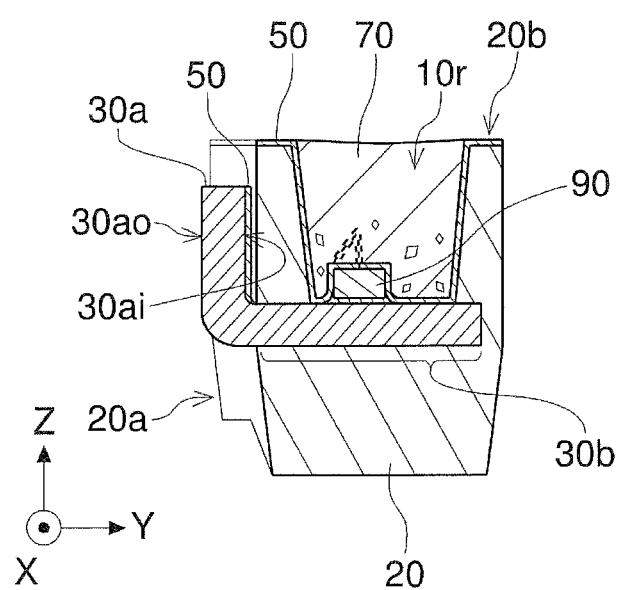
FIG. 1C is a schematic cross sectional view taken along line B-B of FIG. 1A.
Figure 1D:
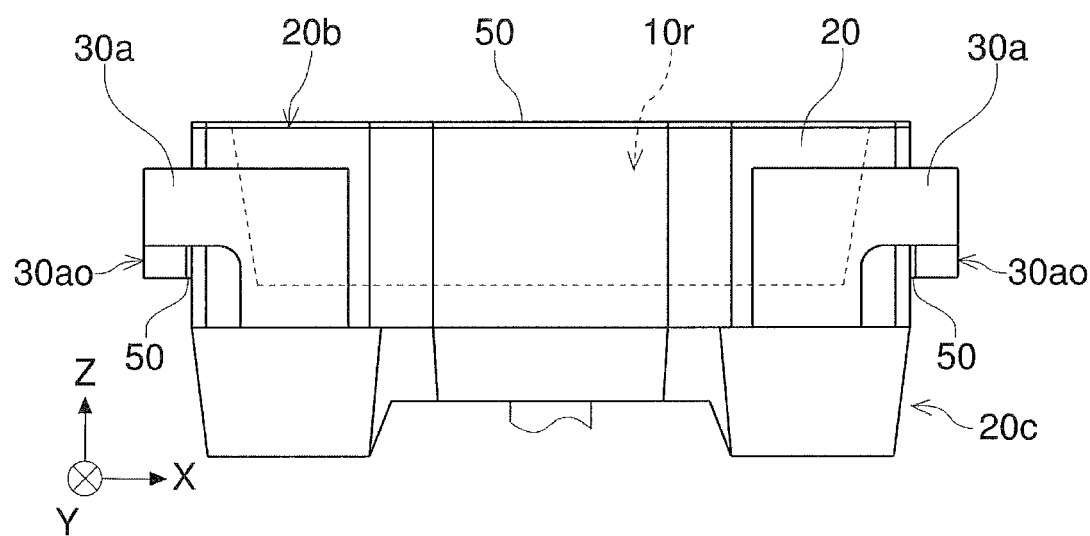
FIG. 1D is a schematic plan view of a mount-side main surface of the light emitting device shown in FIG. 1A.

FIG. 1A is a schematic front view of a light emitting device 100 according to a first embodiment. FIG. 1B is a schematic cross sectional view taken along line A-A in FIG. 1A. FIG. 1C is a schematic cross sectional view taken along line B-B in FIG. 1A. FIG. 1D is a schematic plan view of a mount-side main surface of the light emitting device 100 shown in FIG. 1A.

In the figures, a width direction, a thickness direction, and a depth direction (a front-back direction) of the light emitting device 100 are respectively indicated as an X direction, a Y direction, and a Z direction. In more detail, a rightward direction is indicated as $^+$X direction, a leftward direction is indicated as $^-$X direction, an upward direction is indicated as $^+$Y direction, a downward direction is indicated as $^-$Y direction, a frontward direction is indicated as $^+$Z direction, and a backward direction is indicated as $^-$Z direction. The X, Y, and Z directions (or axes) are perpendicular to each other. In the description below, the first direction may be referred to as $^-$Y direction, and the second direction may be referred to as $^+$Z direction. The first direction is the mounting direction of the light emitting device 100, that is, the mounting surface of the light emitting device 100 faces downward in the first direction. The second direction is a main light-emitting direction of the light emitting device 100.

As shown in FIGS. 1A to 1D, the light emitting device 100 according to the first embodiment includes a housing 10 and at least one light emitting element 40 (may be referred to as "a (the) light emitting element 40" in the description below). The housing 10 includes a resin molded body 20 and lead electrodes 30. The lead electrodes 30 are held by the resin molded body 20. The resin molded body 20 includes a first outer surface 20a facing the first direction and a second outer surface 20b facing the second direction that is perpendicular to the first direction. A recess 10r is formed in the second outer surface 20b of the resin molded body 20, with the lead electrodes 30 defining portions of a bottom of the recess 10r. The light emitting element 40 is housed in the recess 10r of the housing 10. The light emitting element 40 is electrically connected to the lead electrodes 30. Each of the lead electrodes 30 includes an outer lead portion 30a and an inner lead portion 30b. The outer lead portions 30a are portions of the lead electrodes 30 protruding outward from the first outer surface 20a of the resin molded body. The inner lead portions 30b are portions of the lead electrodes 30 other than the outer lead portions 30a and located inside of the resin molded body 20. Portions of the inner lead portions 30b are exposed from the resin molded body 20 and defining portions of a bottom of the recess 10r. The outer lead portions 30a are protruded from the first outer surface 20a and are bent along the first outer surface 20a toward the second outer surface 20b, respectively. The inward surfaces 30ai of the outer lead portions 30a facing the first outer surface 20a are covered by a coating film 50. The coating film 50 is light-transmissive. Meanwhile, outward surfaces 30ao of the outer lead portions 30a located at opposite side of the inward surfaces 30ai are exposed from the coating film 50.

The light emitting device 100 having such a configuration has the inward surfaces 30ai of the outer leads respectively covered by the coating film 50, so that wet-spreading of a component of a solder such as flux onto the inward surfaces 30ai can be reduced and contamination of the resin molded body 20 and the lead electrodes 30 by the component of the solder can be reduced. The contamination of the lead electrodes 30 is not only contamination of the outer lead portions 30a but also contamination of the inner lead portions 30b due to the component of the solder entering inner side of the resin molded body 20. Moreover, absorption of light by the component of the solder and/or by discolored component of the solder due to light and/or heat can also be reduced. Further, discoloration and/or corrosion of the inward surfaces 30ai of the outer lead portions due to sulfurization or the like can also be reduced. Moreover, development of such discoloration and/or corrosion into the inner lead portions 30b can be reduced. Accordingly, absorption of light and/or degradation of electrical performance due to discoloration and/or corrosion of the lead electrodes 30 can be reduced. Meanwhile, the outward surfaces 30ao of the outer lead portions are exposed from the coating film 50, which can facilitate wetting of a solder. Thus, the outward surfaces of the outer lead portions can serve as good bonding regions. Thus, a light emitting device that can facilitate maintaining of initial performance and provide high reliability can be obtained.

The coating film 50 can be applied to cover an appropriate area of the inward surfaces 30ai of the outer lead portions, but with respect to a whole area of the inward surfaces 30ai, preferably 75% or greater, more preferably 90% or greater, further more preferably the whole area of the inward surfaces 30ai is covered by the coating film 50. In particular, boundary portions between each of the inward surfaces 30ai of the outer lead portions and the first outer surface 20a of the resin molded body 20 are preferably covered by the coating film 50. With the coating film, occurrence of gaps at the boundary of the outer lead portions 30a and the first outer surface 20a can be reduced, so that entering of the component of a solder such as a flux and/or a corrosive gas into the recess 10r through the gaps can be reduced.

Next, preferable configurations of the light emitting device 100 will be described below.

As shown in FIGS. 1A to 1D, the inward surfaces 30ai of the outer lead portions and the coating films 50, respectively facing the first outer surfaces 20a are preferably located at positions opposite sides to the recess 10r. A light source region of the light emitting device 100 is provided in the recess 10r of the housing 10. Therefore, when the inward surfaces 30ai of the outer lead portions that are facing the first outer surface 20a are located at positions opposite sides of the recess 10r, the performance of the light emitting device is more easily affected by contamination of the resin molded body 20 and/or the lead electrodes 30 due to the composition of a solder such as a flux, and/or discoloration and/or corrosion due to sulfurization etc., of the lead electrodes 30. Thus, when the inward surfaces 30ai of the outer lead portions and the coating films 50 that are respectively facing the first outer surface 20a are located at positions opposite sides of the recess 10r, effect of the configuration according to the present embodiment can be further facilitated.

As shown in FIG. 1A, FIG. 1B, and FIG. 1D, the resin molded body 20 includes third outer surfaces 20c each facing a third direction that is perpendicular to the first direction and to the second direction. The outer lead portions 30a each has a first terminal region bent along the first outer surface 20a of the resin molded body 20 and a second terminal region bent along the third outer surface 20c of the resin molded body 20. The outward surface 30ao in the second terminal region is exposed from the coating film 50 so that the outward surface 30ao can serve as a bonding region to form a widening portion (a rising portion) of a solder that is called "side fillet" that can facilitate mounting of the side-emission type light emitting device 100 substantially in parallel to the wiring substrate. Meanwhile, when the inward surface 30ai in the second terminal region is covered by the coating film 50, wet-spreading of the component of a solder such as a flux from the widening portion of the solder onto the inward surface 30ai can be suppressed. Therefore, the inward surfaces 30ai of the outer lead portions and the coating films 50 are preferably located at positions facing the corresponding third outer surfaces 20c. The third direction can either be in the $^+$X direction or in the $^-$X direction. It is more preferable that the inward surface 30ai of the outer lead portion of one lead electrode 30 and the coating film 50 thereon face the third outer surface 20c facing in the $^+$X direction, and the inward surface 30ai of the outer lead portion of another lead electrode 30 and the coating film 50 thereon face the third outer surface 20c facing in the $^-$X direction.

The inward surface 30ai and the outward surface 30ao of each of the outer lead portions are preferably made of silver or a silver alloy. Silver provides good bonding with the solder and/or wires 60, and has a high reflectance in the visible region among metals. However, silver is susceptible to discoloration and/or corrosion by sulfurization and its good initial characteristics may be easily degraded. Therefore, when the inward surface 30ai and the outward surface 30ao of each of the outer lead portions are made of silver or a silver alloy, the effects of the configuration according to the present embodiment can be further facilitated. The surfaces of the inner lead portions 30b that define portions of the bottom of the recess 10r are also preferably made of silver or a silver alloy.

As shown in FIG. 1B and FIG. 1C, the surfaces of the lead electrodes 30 defining portions of the bottom of the recess 10r are preferably covered by the coating film 50. This arrangement allows for a reduction of discoloration and/or corrosion due to sulfurization of the surfaces of the lead electrodes 30 defining portions of the bottom of the recess 10r. Accordingly, absorption of light and/or degradation of electrical performance due to discoloration and/or corrosion of the inner lead portions 30b and further, disconnection of the wires 60 can be reduced. In particular, when the surfaces of the inner lead portions 30b that define portions of the bottom of the recess 10r are made of silver or a silver alloy, the surfaces of the lead electrodes 30 defining the portions of the bottom of the recess 10r are preferably covered by the coating film 50. It is more preferable that the coating film 50 continuously covers the surfaces of the lead electrodes 30 defining the portions of the bottom of the recess 10r to the surfaces defining the lateral surfaces and other portion of the bottom of the recess 10r of the resin molded body 20. This is because with the coating film 50 covering the boundaries between the resin molded body 20 defining the recess 10r and the inner lead portions 30b, entering of the component of a solder such as a flux and/or a corrosive gas into the recess 10r through the gaps that occur in the boundaries can be reduced.

As shown in FIG. 1B, the light emitting element 40 is preferably covered by the coating film 50. With this arrangement, corrosion of the light emitting elements 40 due to a corrosive gas can be reduced. In particular, in order to facilitate further reduction of the corrosion of the light emitting element 40 due to a corrosive gas, the coating film 50 continuously covers the surfaces of the lead electrodes 30 defining the bottom surface of the recess 10r to the light emitting element 40.

As shown in FIG. 1B, the light emitting device 100 includes wires 60 that electrically connect the light emitting element 40 and the lead electrodes 30 at the bottom of the recess 10r. The wires 60 are preferably covered by the coating film 50. With this arrangement, problems such as disconnection of the wires 60 can be reduced. In particular, in order to facilitate further reduction of the disconnection of the wires 60, the connecting portions of the wires 60 and the lead electrodes 30 are preferably respectively covered by the coating film 50. Further, as in the lead electrodes 30 described above, when the surfaces of the wires 60 are made of silver or a silver alloy, the effects of the configuration according to the present embodiment can be further facilitated.

The coating film 50 may be an organic film such as a resin film, but in view of heat-resisting property and light-resisting property, an inorganic film is preferable, and an non-metal film is more preferable. The coating film 50 may be electrically conducting film, but in view of avoiding an unintended occurrence of short-circuit, an electrically insulating film is preferable. Further, in view of reducing excess wet-spreading of a solder component, wettability of the solder to the coating film 50 is preferably lower than that of the metal material of the surfaces of the lead electrodes 30. Examples of the material of such a coating film 50 include oxides, nitrides, fluorides of a metal or silicon. More specifically, the coating film 50 is preferably made of an oxide, a nitride, or an oxynitride of at least one element selected from the group consisting of silicon, aluminum, gallium, niobium, tantalum, yttrium, and hafnium. Alternatively, the coating film 50 is preferably made of a fluoride of at least one element selected from the group consisting of magnesium, calcium, barium, and lithium. Among those, the coating film 50 is particularly preferably made of an oxide, a nitride, or an oxynitride of at least one element selected from the group consisting of silicon and aluminum that has good light-transmissive properties and relatively high gas barrier properties.

The resin molded body 20 may have an appropriate thickness (an upper-limit value) in the first direction, but the thickness of 1.2 mm or less is preferable, 1.0 mm or less is more preferable, and 0.8 mm or less is further preferable. The smaller the thickness of the resin molded body 20 in the first direction, the smaller the thicknesses of the lateral walls around the recess 10r, which may results in an increase of leaking light from the lateral walls and/or entering of a solder component such as a flux into the recess 10r. The lower-limit value of the thickness of the resin molded body 20 in the first direction may be, in view of moldability or strength of the resin molded body 20, for example, 0.2 mm or greater.

As shown in FIGS. 1A to 1C, the light emitting device 100 further includes a sealing member 70 filled in the recess 10r. The sealing member 70 preferably contains a fluorescent material 80 to absorb light of the light emitting element 40 and emit light. The light emitting device 100 includes a fluorescent material 80 in addition to the light emitting element 40, which allows to emit light from a wider region in the recess 10r to increase the amount of emitting light, which also increases heat generation and accelerates sulfurization of the lead electrodes 30 and discoloration of solder material such as a flux, to which the effects of the configuration according to the present embodiment can be further facilitated.

The light emitting device 100 can be manufactured as shown below, for example. A flat plate-shaped lead frame having lead electrodes 30 for a plurality of light emitting devices is provided and resin molded bodies 20 for a plurality of light emitting devices are formed on the lead frame to form a plurality of housings 10. The recess 10r defined in each of the housings 10 opens upward that is an upper surface side of the lead frame. A light emitting element 40 is mounted in the recess 10r of each of the housings 10. A coating film 50 is disposed on an approximately entire upper surface side of the lead frame. A sealing member 70 is filled in the recess 10r of each of the housings 10. Then, outer lead portions 30a of each of the housings 10 are cut from a frame portions of the lead frame and respectively bent on the opening side of the recess 10r, then, each of the housings 10 is removed from corresponding suspension lead of the frame portion of the lead frame.

The embodiments according to the present invention will be described below with reference to the drawings.

Housing 10

The housing 10 is a container to house a light emitting element 40 and has terminals (electrodes) to supply electricity to the light emitting element 40 from the outside. The housing 10 at least includes a resin molded body 20 and lead electrodes 30. The housing 10 may be a so-called "package", for example. The housing 10 according to the present embodiment is configured to be used for side-emission type (also called side-view type) light emitting devices.

Resin Molded Body 20

The resin molded body 20 serves as a base body of the container in the housing 10. The resin molded body 20 constitutes a part of an outer shape of the housing 10. In view of light extraction efficiency in the frontward direction, the resin molded body 20 preferably has an optical reflectance of 70% or greater, more preferably 80% or greater, further preferably 90% or greater at the emission peak wavelength of the light emitting element 40. Moreover, the resin molded body 20 preferably has a white color. The material of the resin molded body 20 passes through a flowable state, that is, a fluid state (inclusive of a sol-like state or a slurry-like state) before being hardened or cured. The resin molded body 20 can be molded by using an injection molding method, a transfer molding method, or the like.

For a base material of the resin molded body 20, a thermoplastic resin or a thermosetting resin can be used. The examples of the resins shown below include their modified resins and their hybrid resins. Thermosetting resins are more preferable than thermoplastic resins, because of their higher heat-resisting and light-resisting properties, longer operational life, and higher reliability. Examples of the thermosetting resins include epoxy resins, silicone resins, poly bismaleimide triazine resins, polyimide resins, polyurethane resins, and unsaturated polyester resins. Of those, one resin selected from the group consisting of epoxy resins, silicone resins, and unsaturated polyester resins is preferably used. In particular, unsaturated polyester resins and their modified resins and their hybrid resins are preferable because they can be molded by using an injection molding method and has good mass productivity while having high heat-resisting and light-resisting properties of thermosetting resins. More specific examples include resins described in Japanese Unexamined Patent Application Publication No. 2013-153144, Japanese Unexamined Patent Application Publication No. 2014-207304, and Japanese Unexamined Patent Application Publication No. 2014-123672. Meanwhile, because of their lower prices compared to those of thermosetting resins, thermoplastic resins may be preferably used for the material of the resin molded body 20. Examples of thermoplastic resins include aliphatic polyamide resins, semiaromatic polyamide resins, aromatic polyphthalamide resins, polycyclohexylenedimethylene terephthalate, polyethylene terephthalate, polycyclohexane terephthalate, liquid crystal polymers, and polycarbonate resins. Of those, one resin selected from the group consisting of aliphatic polyamide resins, polycyclohexene terephthalate, and polycyclohexylenedimethylene terephthalate is preferably used. In view of light-reflecting properties, mechanical strength, thermal expansion/contraction properties, or the like, the resin molded body 20 preferably contains a white pigment and a filler material, but instead, other appropriate material may also be employed.

Examples of the while pigment include titanium oxide, zinc oxide, magnesium oxide, carbonate magnesium, magnesium hydroxide, calcium carbonate, calcium hydroxide, calcium silicate, magnesium silicate, barium titanate, barium sulfate, aluminum hydroxide, aluminum oxide, and zirconium oxide. For the white pigment, one of the above may be used alone or two or more of the above may be used in combination. Of those, titanium oxide is preferable because of its relatively high refractive index and high opacifying properties. The white pigment can have an appropriate shape which may be irregular shape (crushed shape), but in view of fluidity, an approximately spherical shape is preferable. The white pigment can have an appropriate particle size (hereinafter, the particle size may be represented by a median particle size $D_{50}$), which is preferably 0.01 µm to 1 µm, more preferably 0.1 µm to 0.5 µm. The resin molded body 20 can contain an appropriate amount of the white pigment. The larger the content of the white pigment, the better in view of light-reflecting properties of the resin molded body 20, but in consideration of influence on the fluidity, the content is preferably in a range of 20 wt % to 70 wt %, more preferably 30 wt % to 60 wt %. In the above, "wt %" stands for "weight percent", indicating a weight ratio of corresponding material with respect to a total weight of all the component materials.

Examples of the filler include silicon oxide, aluminum oxide, glass, potassium titanate, calcium silicate (wallastonite), mica, and talc. For the filler, one of the above may be used alone or two or more of the above may be used in combination. Note that the filler and the white pigment are made of different materials. In particular, in order to reduce thermal expanding coefficient of the resin molded body 20, silicon oxide having a particle size preferably in a range of 5 µm to 100 µm, more preferably in a range of 5 µm to 30 µm is preferably used as a thermal expanding coefficient reducing agent. In order to enhance the mechanical strength of the resin molded body 20, glass, potassium titanate, calcium silicate (wallastonite) can be preferably used as an enhancing agent. Among those, calcium silicate (wallastonite) or potassium titanate has a relatively small particle size, so that it is suitable for the resin molded body 20 having a small thickness or a small size. More specifically, such an enhancing agent has a fiber-like shape with an appropriate average fiber diameter, which may be in a range of 0.05 µm to 100 µm, preferably in a range of 0.1 µm to 50 µm, more preferably in a range of 1 µm to 30 µm, further preferably in a range of 2 µm to 15 µm. The enhancing agent also has an appropriate average fiber length, which may be in a range of 0.1 µm to 1 mm, preferably in a range of 1 µm to 200 µm, more preferably in a range of 3 µm to 100 µm, further preferably in a range of 5 µm to 50 µm. The enhancing agent has an appropriate average aspect ratio (i.e., average fiber length/average fiber diameter), which may be in a range of 2 to 300, preferably in a range of 2 to 100, more preferably in a range of 3 to 50, further preferably in a range of 5 to 30. The filler can have an appropriate shape which may be irregular shape (crushed shape), but in view of the function of enhancing agent, a fiber-like shape (a needle-like shape) or a plate-like shape (a scale-like shape) is preferable and in view of fluidity, an approximately spherical shape is preferable. The content of the filler in the resin molded body 20 can be appropriately determined according to the thermal expanding coefficient, mechanical strength, and the like of the resin molded body 20, which is preferably in a range of 10 wt % to 80 wt %, more preferably in a range of 30 wt % to 60 wt % (in which, the enhancing agent is preferably in a range of 5 wt % to 30 wt %, more preferably 5 wt % to 20 wt %).

Lead Electrode 30

Lead electrodes 30 serve as positive and negative terminals (electrodes) of the housing 10. A single housing 10 includes at least one pair of the lead electrodes 30 but may include three or more of the lead electrodes 30. The lead electrodes 30 provided to a single housing 10 may be extended from different outer surfaces of the resin molded body 20 respectively, but all the lead electrodes 30 are preferably extended from a single outer surface of the resin molded body 20. The lead electrodes 30 respectively include a base material that may be a plate of copper, aluminum, gold, silver, tungsten, iron, nickel, cobalt, molybdenum, or alloy of the foregoing metals, which may be subjected to various works such as pressing (including punching), etching, rolling and the like. The lead electrodes 30 may be made of a layered body of the foregoing metals or alloy thereof, but a single layer may be employed for the sake of simplicity. In particular, copper alloy whose main component is copper (for example, phosphor bronze, copper-iron alloys and the like) is preferable. Further, a light reflective film of silver, aluminum, rhodium, or alloy of the foregoing metals may be provided on the surface thereof. Of those, silver or silver alloy having good light reflectivity is preferable. In particular, a film (for example, a plated film) of silver or a silver alloy, made with a sulfur-based brightening agent has a smooth surface and high light-reflecting properties. The sulfur and/or sulfur compound in the brightening agent may be scattered in crystal grains and/or crystal grain boundaries of silver or silver alloy, with a sulfur content in a range of 50 ppm to 300 ppm, for example. An appropriate degree of glossiness of the light reflective film can be employed which may be preferably 1.5 or greater, and more preferably 1.8 or greater. In the present specification, the degree of glossiness is determined as a value obtained by measurement using a digital densitometer Model 144 manufactured by GAM (Graphic Arts Manufacturing) Company. The lead electrodes 30 of an appropriate thickness can be employed, which may be in a range of 0.05 mm to 1 mm, preferably in a range of 0.07 mm to 0.3 mm, and more preferably in a range of 0.1 mm to 0.2 mm. The lead electrodes 30 may each be a small piece of a lead frame.

Light Emitting Element 40

For the light emitting element 40, a semiconductor light emitting element such as an LED can be used. In many cases, a light emitting element 40 includes a substrate, but a light emitting element 40 at least includes an element structure made of various semiconductor materials, and a pair of positive and negative (p-, n-) electrodes. In particular, a light emitting element of a nitride-based semiconductor ($In_xAl_yGa_{1-x-y}N$, $0 \leq x$, $0 \leq y$, $x+y \leq 1$) that can emit light in a range of ultraviolet to visible light is preferable. The light emitting element 40 preferably has a peak emission wavelength in a range of 445 nm to 465 nm, in view of luminous efficiency, color mixing with light from a different light source, excitation efficiency of a fluorescent material, and the like. In addition, light emitting element of a gallium arsenic-based semiconductor or a gallium phosphorus-based semiconductor, or the like, that can emit light in a range of green to red range may be contained. When the light emitting element 40 has positive and negative electrodes on a same surface side, the positive and negative electrodes are electrically connected to corresponding lead electrodes 30 via wires 60 respectively (i.e., face-up mounting). Alternatively, the positive and negative electrodes may be electrically connected to corresponding lead electrodes 30 via an electrically conductive bonding member respectively (i.e., flip-chip mounting or face-down mounting). When the light emitting element 40 has an opposite electrode structure in which either the positive electrode or the negative electrode is provided on a lower surface and the other electrode is provided on an upper surface opposite to the lower surface, the lower-surface electrode provided on the lower-surface may be bonded to one lead electrode 30 via an electrically conductive bonding member and the upper-surface electrode provided on the upper surface may be bonded to another lead electrode 30 via the wire 60. The number of the light emitting element(s) 40 mounted in a single housing 10 may be either one or two or more. When two or more light emitting elements 40 are mounted, the light emitting elements 40 can be electrically connected either in series or in parallel by wires 60. Further, three light emitting elements 40 respectively configured to emit light of blue, green, and red light may be mounted in a single housing 10.

Coating Film 50

The coating film 50 may be a single film for ease of manufacturing, but the coating film 50 of a multilayer film can enhance gas barrier properties. The coating film 50 of an appropriate thickness can be used, but in view of the gas barrier properties, light-transmissive properties, the thickness is preferably in a range of 1 nm to 1000 nm, more preferably in a range of 5 nm to 500 nm, further preferably in a range of 10 nm to 100 nm. The coating film 50 can be disposed by using, for example, at least one method of a sputtering method, a vapor deposition method, an atomic layer deposition method, a printing method, and a spraying method. Of those, a sputtering method is preferable in view of both of mass productivity and film quality. An atomic layer deposition method is preferable because a film of dense and extremely high gas barrier properties can be easily disposed. When the coating film 50 is disposed on the outward surface 30ao of the outer lead portion, solderability of the light emitting device may be reduced. For this reason, the coating film 50 is preferably disposed on the inward surface 30ai of the outer lead portion facing the first outer surface 20a, by using an anisotropic deposition method such as a sputtering method or a printing method. When an isotropic deposition method such as an atomic layer deposition method is used, it is preferable that the coating film 50 is disposed on an entire of the outer lead portion 30a, then, the coating film 50 on the outward surface 30ao of the outer lead portion is removed by blasting or the like so that the outward surface 30ao of the outer lead portion is exposed from the coating film 50.

Wire 60

The wires 60 are electrically conductive and are used to electrically connect electrodes of the light emitting element 40 and lead electrodes 30, respectively. The wires 60 can also be used to electrically connect the electrodes of the protective element 90 and corresponding lead electrodes 30, respectively. More specifically, metal wires (the term "metal" used in the present specification includes an alloy) made of gold, silver, copper, platinum, aluminum, palladium, or an alloy of one or more of those can be used. In particular, an Au wire or an Au-alloy wire, with which breakage due to stress from the sealing member 70 hardly occurs and which has good heat-resistance, is preferable. Also, in order to enhance light-reflecting properties, at least the surfaces of the wires 60 may be made of silver or a silver alloy. The wires 60 of an appropriate diameter can be used, which is preferably in a range of 5 μm to 50 μm, more preferably in a range of 10 μm to 40 μm, further preferably in a range of 15 μm to 30 μm.

Sealing Member 70

The sealing member 70 is configured to seal the light emitting element 40 to protect the light emitting element 40 from dust, moisture, external force, or the like. The sealing member 70 is electrically insulating and is light-transmissive to light emitted from the light emitting element 40. The sealing member 70 preferably has an optical reflectance of 60% or greater, more preferably 70% or greater, further preferably 80% or greater at the emission peak wavelength of the light emitting element 40. The sealing member 70 includes a base material as described below. The base material preferably contains a fluorescent material. The sealing member 70 is optional but is preferably provided.

Specific examples of the base material of the sealing member 70 include silicone resin, epoxy resin, phenol resin, polycarbonate resin, acrylic resin, TPX resin, polynorbornene resin, or modified resin thereof or hybrid resin thereof. Of those, silicone-based resin (silicone resin, modified resin thereof, and hybrid resin thereof) has a low modulus of elasticity and has high heat-resisting property and light-resisting property, while having relatively high gas permeability, to which effects of the configuration according to the present embodiment can be facilitated. Silicone-based resin that contains a phenyl group (e.g., methyl phenyl silicone resin, diphenyl silicone resin, or the like) exhibits relatively high heat-resisting properties and gas barrier properties among silicone-based resins and preferable. The content of the phenyl group in all the organic groups coupled to silicon atoms in the silicone-based resin containing phenyl group can be, for example, in a range of 5 mol % to 80 mol %, preferably in a range of 20 mol % to 70 mol %, and more preferably in a range of 30 mol % to 60 mol %.

Fluorescent Material 80

The fluorescent material layer 80 absorbs at least a part of primary light emitted from the light emitting element 40 and emits secondary light having different wavelength than that of the primary light. Accordingly, the light emitting device that can emit mixed-color light (for example, white light) of the primary light of visible wavelength and the secondary light of visible wavelength can be obtained. For the fluorescent material 80, these substances shown below as specific examples may be used singly or as combination of two or more of these. Specific examples of the fluorescent material 80 that can emit green to yellow light include a yttrium-aluminum-garnet-based fluorescent material (for example, $Y_3(Al,Ga)_5O_{12}$:Ce), a lutetium-aluminum-garnet-based fluorescent material (for example $Lu_3(Al,Ga)_5O_{12}$:Ce), a silicate-based fluorescent material (for example $(Ba,Sr)_2SiO_4$:Eu), a chlorosilicate-based fluorescent material (for example $Ca_8Mg(SiO_4)_4Cl_2$:Eu), and a β-sialon-based fluorescent material (for example $Si_{6-z}Al_zO_zN_{8-z}$:Eu ($0<Z<4.2$)). Specific examples of the fluorescent material 80 that can emit red light include a nitrogen-containing calcium aluminosilicate (CASN or SCASN)-based fluorescent material (for example (Sr,Ca)$AlSiN_3$:Eu), a manganese-activated potassium fluosilicate-based fluorescent material (for example, $K_2SiF_6$:Mn). Examples of the fluorescent material 80 also include quantum dots. The quantum dots are particles having the particle size in a range of about 1 nm to about 100 nm, whose emission wavelength can be changed according to the particle size. Specific examples of the quantum dots include cadmium selenide, cadmium telluride, zinc sulfide, cadmium sulfide, lead sulfide, lead selenide, cadmium telluride, and mercury.

When a potassium fluosilicate-based fluorescent material is contained as a fluorescent material 80 in the sealing member 70, the inner lead portions 30b exposed from the resin molded body 20 and defining the portion of the inner bottom surface of the recess 10r are preferably covered by the coating film 50. This arrangement can reduce corrosion that may occur when fluorine generated by a reaction of the potassium fluosilicate-based fluorescent material with moisture or the like reacts with a metal (particularly silver or silver alloy) of the surfaces of the inner lead portions 30b. Because the potassium fluosilicate-based fluorescent material has low water resistance, in order to reduce influence of moisture outside of the light emitting device 100, the potassium fluosilicate-based fluorescent material may be arranged in the sealing member 70 at locations near the inner bottom surface of the recess 10r, in other words, the potassium fluosilicate-based fluorescent material is distributed near the inner lead portions 30b. In such a case, covering the inner lead portions 30b is particularly preferable.

Specific examples of the filler of the sealing member 70 include silicon oxide, aluminum oxide, zirconium oxide, and zinc oxide. For the filler of the sealing member 70, one of the above may be used alone or two or more of the above may be used in combination. In particular, silicon oxide is preferable for the thermal expanding coefficient reducing agent of the sealing member 70. The filler of the sealing member 70 can have an appropriate shape which may be irregular shape (crushed shape), but in view of fluidity, an approximately spherical shape is preferable. The content of the filler in the sealing member 70 can be appropriately determined according to the thermal expanding coefficient, fluidity, and the like of the sealing member 70, which is preferably in a range of 0.1 wt % to 50 wt %, more preferably in a range of 1 wt % to 30 wt %. Further, with the use of nanoparticles (e.g., particles size in a range of 1 nm to 100 nm) as the filler of the sealing member 70, scattering of light (including Rayleigh scattering) of short wavelength such as blue light of the light emitting element 40 can be increased, which also allows to reduce the amount of the fluorescent material 80. For such nanoparticle filler, for example, silicon oxide or zirconium oxide is preferable.

Protective Element 90

The light emitting device 100 according to the present embodiment has a protective element 90 housed in the recess 10r and is electrically connected to the lead electrodes 30. The protective element 90 is configured to protect the first light emitting element 40 from electrostatic discharge and/or high-voltage surge. More specific example of the protective element 90 include a Zener diode. With the protective element 90, reliability of the light emitting device 100 can be enhanced.

Bonding Member

The bonding member may either be electrically insulating or electrically conducting and is configured to bond the light emitting element 40 to the lead electrodes 30. The bonding member can also to the lead electrodes 30. Examples of electrically insulating bonding member include epoxy resin, silicone resin, polyimide resin, modified resin thereof, and hybrid resin thereof. Examples of electrically conducting bonding member include electrically conductive paste of silver, gold, palladium, or the like, and solder such as tin-bismuth-based solder, tin-copper-based solder, tin-silver-based solder, gold-tin-based solder, or the like.

EXAMPLES

Hereinafter, examples according to the embodiments of the present invention will be described in detail. Needless to say, the present invention is not limited only to the examples described below.

Example 1

A light emitting device of Example 1 is a side-surface light emission type LED having the structure of the light emitting device 100 in the example illustrated in FIGS. 1A to 1D. The light emitting device (i.e., the housing) has a size of a lateral width of 2.8 mm, a depth of 1.2 mm, and a thickness of 1.0 mm.

The housing is formed by molding a resin molded body integrally with a first lead electrode (a negative electrode) and a second lead electrode (a positive electrode). The housing defines a recess in its front surface, with an opening of a lateral length of 0.87 mm, a longitudinal length of 2.16 mm, and a depth of 0.55 mm. The resin molded body contains, in the base material of unsaturated polyester resin, 40 wt % of a white pigment of titanium oxide, 25 wt % of spherical silicon oxide, and 10 wt % of a filler of fibrous glass. The resin molded body is molded by using an injection molding method, and has a gate mark at approximately the center of the back surface. The gate mark is a protrusion formed at the gate that is a resin injection port of a metal mold. The first lead electrode and the second lead electrode are each a metal piece with a thickness of 0.15 mm, which is made of a base material of copper alloy provided with a light-reflecting film of silver disposed by plating. The first lead electrode includes a first inner lead portion located at an inner side of the resin molded body and a first outer lead portion located at an outer side of the resin molded body. The second lead electrode includes a second inner lead portion located at an inner side of the resin molded body and a second outer lead portion located at an outer side of the resin molded body. The resin molded body includes inner lateral surfaces and an inner bottom surface. The lateral surfaces define inner wall of the recess. Surfaces of the first inner lead portions and the second inner lead portions and the inner bottom surface of the resin molded body define a bottom of the recess. The first outer lead portions and the second outer lead portions are extended from an outer bottom surface that is a mounting side main surface of the resin molded body and are bent forward along the outer bottom surface, and further bent along the left outer lateral surface and the right outer lateral surface of the resin molded body, respectively.

In the recess of the housing, a single light emitting element and a single protective element are accommodated. The light emitting element is an approximately rectangular parallelepiped-shaped LED chip which has an n-type layer, an active layer, and a p-type layer of nitride semiconductors stacked on a sapphire substrate, and can emit blue light (emission peak wavelength of about 455 nm), and has a longitudinal length of 0.55 mm, a lateral length of 0.55 mm, and a thickness of 0.20 mm. The light emitting element is bonded on the first inner lead portions by a bonding member and an n-electrode and a p-electrode are connected to the first inner lead portion and the second inner lead portion via wires respectively. The bonding member is an epoxy-silicone hybrid resin. The wires are gold wires with a diameter of 25 µm. The protective element is an approximately rectangular parallelepiped-shaped Zener diode chip with a longitudinal length of 0.15 mm, a lateral length of 0.15 mm, and a thickness of 0.10 mm. The protective element is bonded on the second inner lead portion by a bonding member of silver paste and is electrically connected to the first inner lead portion via a wire that is a gold wire of a same diameter as that used to connect the light emitting element.

The sealing member is filled in the recess of the housing to cover the light emitting element, the protective element, and the wires. The sealing member includes a base material made of methyl phenyl silicone resin, which contains a YAG:Ce-based fluorescent material that can emit yellow-green light (a peak light emission wavelength of about 560 nm), and 0.4 wt % of approximately spherical silicon oxide filler. The front surface of the sealing member is approximately in the same plane with the front surface of the resin molded body (the front surface of the sealing member is slightly concaved due to cure shrinkage). The fluorescent material is distributed in the sealing member with a greater amount closer to the bottom surface of the recess.

The inward surfaces of the first outer lead portions and the second outer lead portions with respect to the resin molded body are covered by the coating film of silicon oxide with a thickness of about 50 nm, disposed by using a sputtering method. The inward surfaces of the first outer lead portions and the second outer lead portions with respect to the resin molded body, respectively facing the outer bottom surface of the resin molded body and the coating film on the inward surfaces are respectively continuous from the border to the outer bottom surface of the resin molded body to locations that face the recess. Further, the coating film continuously covers the surfaces of the resin molded body defining the lateral surfaces and the portions of the bottom of the recess, the first inner and second inner lead portions defining other portion of the bottom of the recess, the light emitting element, the protective element, and the wires. Meanwhile, the outward surfaces of the first outer lead portion and the second outer lead portions are exposed from the coating film, in other words, the surfaces of silver are exposed.

The light emitting device according to Example 1 having a configuration as described above can express similar effects as that of the light emitting device 100 according to the first embodiment.

The light emitting device according to the embodiment of the present invention is applicable for a backlight light source of a liquid crystal display, various illumination devices, various display apparatuses such as a large-screen display, an advertisement, a destination guide and the like, and furthermore, an image reading apparatus in a digital video camera, a facsimile, a copier, a scanner and the like, a projector apparatus and the like.

It is to be understood that although the present invention has been described with regard to preferable embodiments thereof, various other embodiments and variants may occur to those skilled in the art, which are within the scope and spirit of the invention, and such other embodiments and variants are intended to be covered by the following claims.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a housing comprising:
      a resin molded body having a first outer surface facing toward a first direction, a second outer surface facing toward a second direction perpendicular to the first direction, and a recess having an opening on the second outer surface and a bottom opposite to the opening in the second direction; and
      lead electrodes provided in the resin molded body, each of the lead electrodes comprising:
         an outer lead portion provided on the first outer surface and comprising:
            an inward surface facing the first outer surface and made of a light reflective material;
            an outward surface opposite to the inward surface in the first direction and made of the light reflective material; and
            a light-transmissive coating film provided on the inward surface between the first outer surface and the inward surface;
         an inner lead portion provided to define the bottom of the recess and connected to the outer lead portion; and
   at least one light emitting element provided in the recess and electrically connected to the lead electrodes.

2. The light emitting device according to claim 1, wherein the inward surface and the light-transmissive coating film faces the recess.

3. The light emitting device according to claim 1, wherein the resin molded body further has a third outer surface facing toward a third direction which is perpendicular to the first direction and the second direction, and the inward surface and the light-transmissive coating film of at least one of the lead electrodes are provided to face the third outer surface.

4. The light emitting device according to claim 1, wherein a surface of the inner lead portion which defines the bottom of the recess is covered by the light-transmissive coating film.

5. The light emitting device according to claim 1, wherein the at least one light emitting element is covered by the light-transmissive coating film.

6. The light emitting device according to claim 1, further comprising:
   wires electrically connecting the at least one light emitting element and the inner lead portions of the lead electrodes, the wires being covered by the light-transmissive coating film.

7. The light emitting device according to claim 6, wherein surfaces of the wires are made of silver or a silver alloy.

8. The light emitting device according to claim 1, wherein the light-transmissive coating film is made of an oxide, a nitride, or an oxynitride of at least one element selected from the group consisting of silicon, aluminum, gallium, niobium, tantalum, yttrium, and hafnium, or a fluoride of at least one element selected from the group consisting of magnesium, calcium, barium, and lithium.

9. The light emitting device according to claim 1, wherein the resin molded body has a thickness of 1.2 mm or less in a direction in parallel to the first direction.

10. The light emitting device according to claim 1, further comprising a sealing member filled in the recess, the sealing member containing a fluorescent material to absorb light of the light emitting element and emit light.

11. The light emitting device according to claim 1, wherein a base material of the resin molded body is a thermosetting resin.

12. The light emitting device according to claim 1, wherein a base material of the resin molded body is an unsaturated polyester resin, or a modified resin or a hybrid resin of the unsaturated polyester resin.

13. The light emitting device according to claim 1, wherein the first direction is a mounting direction of the light emitting device.

14. The light emitting device according to claim 1, wherein the outward surface serves as a mounting surface of the light emitting device.

15. The light emitting device according to claim 1, wherein the outer lead portion is provided by bending a flat lead electrode having the inner lead portion.

16. The light emitting device according to claim 1, wherein the inner lead portion is provided to define a portion of the bottom of the recess.

17. The light emitting device according to claim 1, wherein the light reflective material is silver or a silver alloy.

18. The light emitting device according to claim 1, wherein the light reflective material is a light reflective film of silver, silver alloy, aluminum, aluminum alloy, rhodium, or rhodium alloy.

19. The light emitting device according to claim 1, wherein the outer lead portion further comprises:
a side surface connecting the inward surface and the outward surface and facing toward the second direction,
wherein the light-transmissive coating film is disposed on the side surface.

20. The light emitting device according to claim 1, wherein the outer lead portion further comprises:
a side surface connecting the inward surface and the outward surface and facing toward the second direction, the side surface being exposed from the light-transmissive coating film.

21. The light emitting device according to claim 1, further comprising:
a protective element provided in the recess such that the first outer surface of the resin molded body is provided between the protective element and the light-transmissive coating film provided on the inward surface of the outer lead portion.

* * * * *